US012787872B2

(12) United States Patent
Deng et al.

(10) Patent No.: US 12,787,872 B2
(45) Date of Patent: Nov. 3, 2026

(54) PIXEL UNIT AND DISPLAY APPARATUS APPLYING THE SAME

(71) Applicant: Ennostar Corporation, Hsinchu City (TW)

(72) Inventors: Shao-You Deng, Hsinchu (TW); Yung-Hsin Lin, Hsinchu (TW); Yu-Yun Chen, Hsinchu (TW)

(73) Assignee: Ennostar Corporation, Hsinchu City (TW)

( * ) Notice: Subject to any disclaimer, the term of this patent is extended or adjusted under 35 U.S.C. 154(b) by 515 days.

(21) Appl. No.: 18/235,458

(22) Filed: Aug. 18, 2023

(65) Prior Publication Data

US 2024/0063198 A1 Feb. 22, 2024

Related U.S. Application Data

(60) Provisional application No. 63/398,971, filed on Aug. 18, 2022.

(51) Int. Cl.

| | |
|---|---|
| ***H01L 25/16*** | (2023.01) |
| ***H10W 90/00*** | (2026.01) |
| *H10H 20/813* | (2025.01) |

(52) U.S. Cl.

CPC .......... *H10W 90/00* (2026.01); *H10H 20/813* (2025.01)

(58) Field of Classification Search

CPC ............................ H10W 90/00; H10H 20/813

See application file for complete search history.

(56) References Cited

U.S. PATENT DOCUMENTS

| | | | | |
|---|---|---|---|---|
| 2012/0133291 A1* | 5/2012 | Kitagawa ............. | H05B 45/395 315/192 |
| 2014/0097762 A1* | 4/2014 | Ide ....................... | H05B 45/397 315/192 |
| 2015/0230298 A1* | 8/2015 | Chu ....................... | H05B 45/48 315/186 |
| 2021/0166618 A1* | 6/2021 | Baumheinrich ..... | G09G 3/2081 |

* cited by examiner

*Primary Examiner* — Peniel M Gumedzoe

(74) *Attorney, Agent, or Firm* — MUNCY, GEISSLER, OLDS & LOWE, P.C.

(57) ABSTRACT

A pixel unit includes a thin film circuit unit and a light emitting device. The thin film circuit unit includes a first driving device having a first terminal, a second terminal, and a control terminal. The first terminal can receive a first signal. The control terminal can receive a second signal to control on/off of the first driving device for allowing the first signal transmitted to the second terminal. The light emitting device includes a plurality of light-emitting elements connected in series and connected to the second terminal, wherein a total voltage of the plurality of light-emitting elements is not less than ⅓ of a saturation voltage of the first driving device.

20 Claims, 8 Drawing Sheets

PIXEL UNIT AND DISPLAY APPARATUS APPLYING THE SAME

REFERENCE TO RELATED APPLICATION

This application claims the right of priority based on U.S. Provisional Application Ser. No. 63/398,971, filed on Aug. 18, 2022, and the content of which is hereby incorporated by reference in its entirety.

TECHNICAL FIELD

The application relates to an electric circuit, a display apparatus, and applications thereof, and more particularly to a pixel unit and a display apparatus applying the same.

DESCRIPTION OF BACKGROUND ART

Display technology has become ubiquitous in our daily life, which convers widespread applications, such as smartphones, tablets, desktop monitors, TVs, data projectors, and augmented reality/virtual reality devices. Micro-LEDs (μLEDs) and mini-LEDs (mLEDs) have emerged as light-emitting devices for next-generation displays, the former is particularly attractive for transparent displays and high luminance displays, while the latter can serve either as a locally dimmable backlight for high dynamic range (HDR) LCDs or as emissive displays. Both mLEDs and μLEDs offer ultra-miniaturized size and long lifetimes. However, there may still remain challenges on power consumption of mLED/μLED displays, which will definitely affect the efficiency.

SUMMARY OF THE APPLICATION

One embodiment of the present application is to provide a subpixel unit, wherein the subpixel unit includes a first thin film circuit unit and a first light emitting device. The first thin film circuit unit includes a first driving device having a first terminal, a second terminal, and a control terminal. The first terminal can receive a first signal. The control terminal can receive a second signal to control on/off of the first driving device for allowing the first signal transmitted to the second terminal. The first light emitting device includes a plurality of first light-emitting elements connected in series and connected to the second terminal, wherein a total voltage of the plurality of first light-emitting elements is not less than ⅓ of a saturation voltage of the first driving device.

Another embodiment of the present application is to provide a pixel unit including a subpixel unit including a first thin film circuit unit and a first light emitting device. The first thin film circuit unit includes a first driving device having a first terminal, a second terminal, and a control terminal. The first terminal can receive a first signal. The control terminal can receive a second signal to control on/off of the first driving device for allowing the first signal transmitted to the second terminal. The first light emitting device includes a plurality of first light-emitting elements connected in series and connected to the second terminal, wherein a total voltage of the plurality of first light-emitting elements is not less than ⅓ of a saturation voltage of the first driving device.

According to the above embodiments, a pixel unit and a display apparatus applying the same are provided, wherein the pixel unit includes a first thin film circuit unit and a first light emitting device connected to a driving device of the first thin film circuit unit, a plurality of first light-emitting elements are connected in series to serve as the first light emitting device, and a total voltage of the plurality of first light-emitting elements is limited not less than ⅓ of a saturation voltage of the driving device for turn on the first light emitting device.

BRIEF DESCRIPTION OF THE DRAWINGS

The above and other aspects of the application will become better understood with regard to the following detailed description of the preferred but non-limiting embodiment(s). The following description is made with reference to the accompanying drawings. It is noted that, in accordance with the standard practice in the industry, various features are not drawn to scale. In fact, the dimensions of the various features may be arbitrarily increased or reduced for clarity of discussion.

DETAILED DESCRIPTION OF THE APPLICATION

The present application provides a pixel unit and a display apparatus applying the same for driving mLED/μLED displays more efficiently to achieve the effective luminance. The above and other aspects of the application will become better understood by the following detailed description of the preferred but non-limiting embodiment(s). The following description is made with reference to the accompanying drawings:

Several embodiments of the present application are disclosed below with reference to accompanying drawings. However, the structure and contents disclosed in the embodiments are for exemplary and explanatory purposes only, and the scope of protection of the present application is not limited to the embodiments. It should be noted that the present application does not illustrate all possible embodiments, and anyone skilled in the technology field of the application will be able to make suitable modifications or changes based on the specification disclosed below to meet actual needs without breaching the spirit of the application. The present application is applicable to other implementations not disclosed in the specification.

Figure 1:
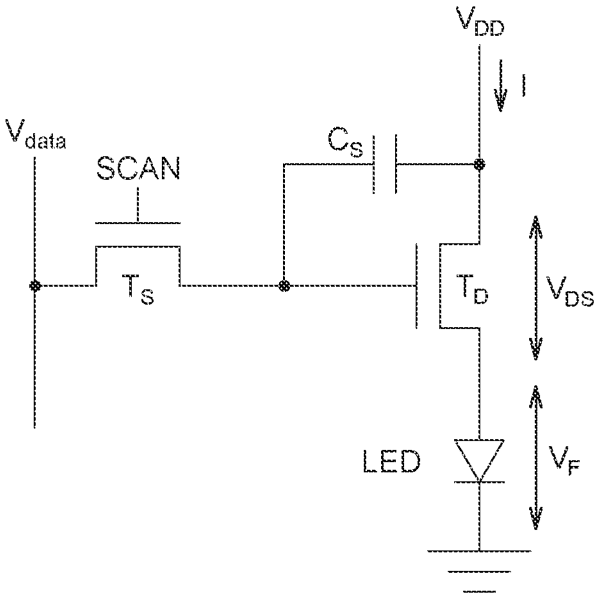
FIG. 1 is a diagram illustrating an equivalent circuit of a basic 2 transistors and 1 capacitor (2T1C) subpixel unit in an active pixel array of a mLED/μLED display.

Typically, an LED display includes a plurality of LED subpixel units each including an LED driven or controlled by a thin-film-transistor (TFT), all together arranged to form a pixel array. The LED may be a mini LED (mLED) or a micro LED (μLED). The LED display may be a mLED display or a μLED display. For example, FIG. 1 is a diagram illustrating an equivalent circuit of a subpixel unit in an active pixel array of a mLED/μLED display. Each subpixel of the mLED/μLED display includes a mLED/μLED, and a 2T1C structure including a switching TFT ($T_S$), a driving TFT ($T_D$), and a capacitor ($C_S$). The gate electrode of the switching TFT ($T_S$) is connected to a scan line SCAN as a switch of the subpixel unit.

Each of the switching TFT ($T_S$) and the driving TFT ($T_D$) includes a gate electrode, a source electrode, and a drain electrode. The driving TFT ($T_D$) can be implemented as an NMOS thin-film transistor, while the switching TFT ($T_S$) can be implemented as a PMOS thin-film transistor. It is, however, to be noted that the technical idea of the present application is not limited thereto. For example, the switching TFT ($T_S$) can be implemented as an NMOS thin-film transistor, while the driving TFT ($T_D$) can be implemented as a PMOS thin-film transistor.

In an embodiment, the switching TFT ($T_S$) is implemented as an NMOS thin-film transistor, while the driving TFT ($T_D$) is implemented as a PMOS thin-film transistor. The source electrode of the switching TFT ($T_S$) is connected to a data voltage line ($V_{data}$). The drain electrode of the switching TFT ($T_S$) is connected to the gate of the driving TFT ($T_D$) to control the on/off of the driving TFT ($T_D$). The source electrode of the driving TFT ($T_D$) is connected to a power source line ($V_{DD}$). The drain electrode of the driving TFT ($T_D$) is connected to the LED. The driving TFT ($T_D$) can regulate the current flowing to the LED through regulating the gate electrode of the driving TFT ($T_D$) by the data voltage line ($V_{data}$). The mLED/μLED can emit light when the driving TFT ($T_D$) is turn on by the data voltage ($V_{data}$) to allow current (I) flowing to the mLED/μLED under a voltage ($V_{DS}$). One end of the capacitor $C_S$ is connected to the power source line ($V_{DD}$) and another end of the capacitor $C_S$ is connected to a node between the drain electrode of the switching TFT ($T_S$) and the gate electrode of the driving TFT ($T_D$). The switching TFT ($T_S$) performs switching operation in response to a scan signal supplied through SCAN so that the data voltage supplied through the data voltage line ($V_{data}$) is stored in the capacitor ($C_S$) and a signal is supplied to the gate electrode of the driving TFT ($T_D$). The gate electrode of the driving TFT ($T_D$) is connected to the drain electrode of the switching TFT ($T_S$). The driving TFT ($T_D$) includes a source electrode connected to the power source ($V_{DD}$) and a drain electrode connected to the mLED/μLED. The drain electrode of the driving TFT ($T_D$) is connected to a positive terminal of the mLED/μLED and a negative terminal of the mLED/μLED is connected to the ground voltage.

In an amorphous silicon (a-Si) TFT array, the voltage drop on the power source line ($V_{DD}$) is about 12V. $V_F$ is the mLED/μLED forward voltage. I is the current through the driving TFT ($T_D$) and mLED/μLED. It is well known that, in operation, the driving TFT ($T_D$) generally consumes more power ($V_{DS}$×I) than that of the mLED/μLED ($V_F$×I). As the LED size shrinks, the luminance of each subpixel may reduce. It may require to increase the luminance of the mLED/μLED. The mLED/μLED typically has a forward voltage ($V_F$) of 2 V to 4 V. The mLED/μLED cannot be connected directly to the voltage sources. Therefore, the mLED/μLED is connected in series with some additional devices (such as resistors) to reduce the drain-to-source voltage ($V_{DS}$) of the driving TFT ($T_D$) for balancing the power consumption ratio between the TFT and LED ($V_{DS}/V_F$) for the purpose of driving the pixel array of the mLED/μLED displays more efficiently. Therefore, a considerable part of the operating voltage is dropped across the series resistor. This leads to a low efficiency since the part of the operating voltage which is dropped across the series resistor is not utilized for generating radiation.

Figure 2:
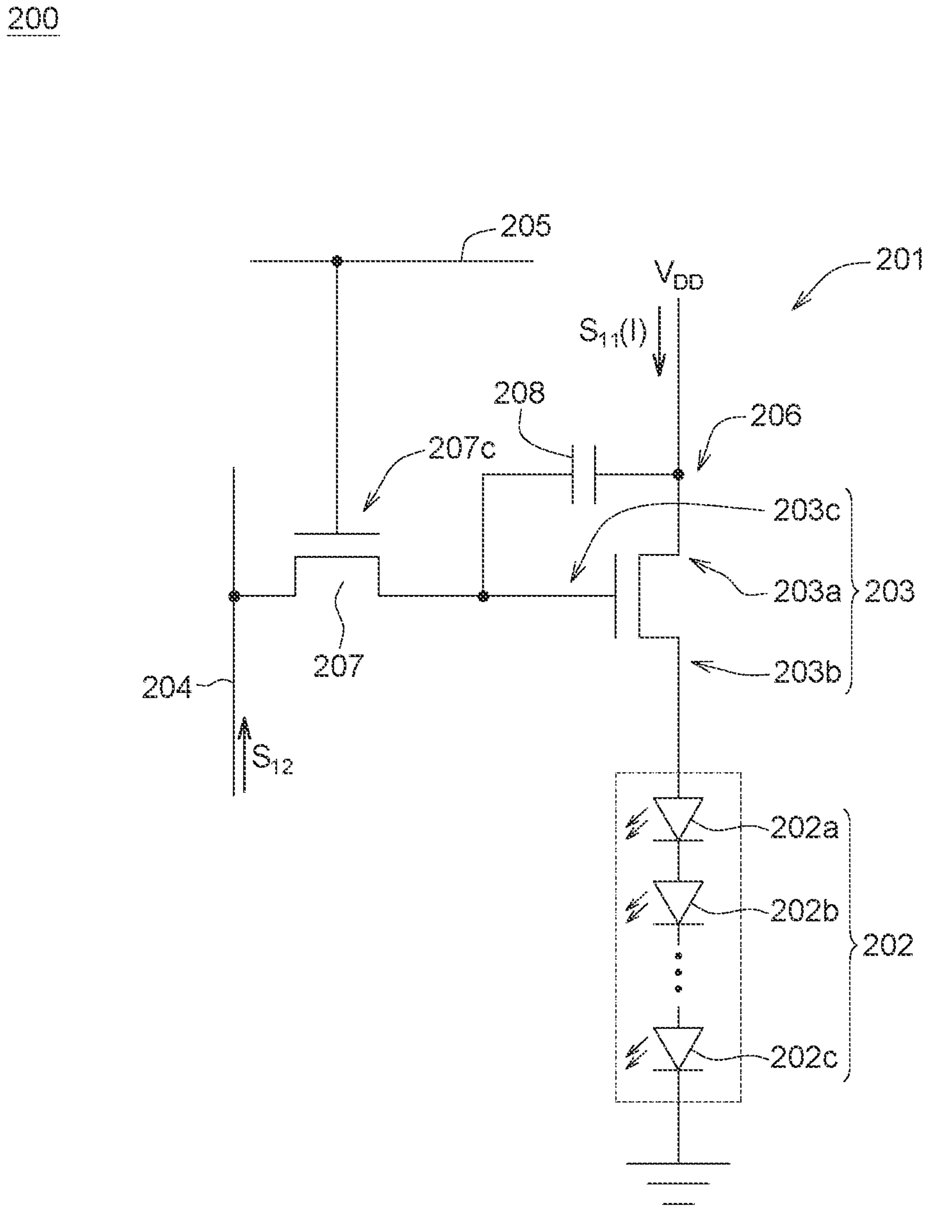
FIG. 2 is a diagram illustrating an equivalent circuit of a subpixel unit according to an embodiment of the present application.

FIG. 2 is a diagram illustrating an equivalent circuit of a subpixel unit 200 according to an embodiment of the present application. In the present application, the subpixel unit 200 includes a first thin film circuit unit 201 and a first light emitting device 202. The first thin film circuit unit 201 includes a driving device 203, such as a thin film transistor (TFT) or a high electron mobility transistor (HEMT), having a terminal 203*a* (such as a source electrode), a terminal 203*b* (such as a drain electrode), and a control terminal 203*c* (such as a gate electrode). In an embodiment, the driving device 203 can be a normally-on transistor or a normally-off transistor so that the polarity of the scan line 205 that controls the switching device 207 to be turned on or off is changed accordingly. The terminal 203*a* can receive a signal S11. The control terminal 203*c* can receive a second signal S12 to control on/off of the driving device 203 for allowing the signal S11 transmitted to the terminal 203*b*. The first light emitting device 202 includes a plurality of first light-emitting elements 202*a*, 202*b*, and 202*c* connected in series and connected to the terminal 203*b*, wherein a total voltage of the plurality of first light-emitting elements 202*a*, 202*b*, and 202*c* is not less than ⅓ of a saturation voltage of the driving device 203 when it is turned on. By the approach, additional device for balancing the power consumption ratio between the TFT and LED ($V_{DS}/V_F$) illustrated in FIG. 1 is no longer required or can be reduced. Meanwhile, the luminance of the light emitting device in one single subpixel can be increased since the amount of the light-emitting elements is increased while the size of the light emitting device shrank.

The first thin film circuit unit 201 further includes a data line 204, a scan line 205, a power source ($V_{DD}$) 206, a switching device 207, and a capacitor 208. The power source ($V_{DD}$) 206 is connected to the terminal 203*a* to provide the signal S11. The data line 204 is connected to the control terminal 203*c* through the switching device 207 to provide the second signal S12. The switching device 207 includes a gate terminal 207*c*. The scan line 205 is connected to the gate terminal 207*c* of the switching device 207 for controlling whether the second signal S12 can pass through the switching device 207 and reach to the control terminal 203*c* of the driving device 203.

One end of the first light emitting device 202 (the plurality of first light-emitting elements 202*a*, 202*b*, and 202*c* is connected in series) is connected to the terminal 203*b* of the driving device 203, the other end of the first light emitting device 202 is grounded. One end of the capacitor 208 is connected to the power source ($V_{DD}$) 206, and the other end of the capacitor 208 is connected to the control terminal 203*c* of the driving device 203 and the switching device 207 through a node therebetween.

In some embodiments of the present application, the driving device 203 is a thin film transistor (TFT), and the first light emitting device 202 is a p-LED device with a size (length or width in the top view) ranging from 100 μm to 10 μm and having a plurality of p-LED elements (serving as the first light-emitting elements 202*a*, 202*b*, and 202*c*) formed on a substrate (not shown). In another embodiment of the present application, the first light emitting device 202 is a mini-LED (mLED) device with a size (length or width in the top view) ranging from 200 μm to 100 μm and having a plurality of mini-LED elements (serving as the first light-emitting elements 202*a*, 202*b*, and 202*c*) formed on a substrate (not shown).

In addition, the first light-emitting elements 202*a*, 202*b*, and 202*c* involved in the first light emitting device 202 may be identical to or different from each other in terms of size, materials and so on. In some embodiments, the plurality of first light-emitting elements 202*a*, 202*b*, and 202*c* all emit lights with substantially the same wavelength. For example, in one embodiment, the first light-emitting elements 202*a*, 202*b*, and 202*c* all emit blue light with wavelength ranging from 400 nm to 500 nm, red light with wavelength ranging from 620 nm to 750 nm, or green light with wavelength ranging from 495 nm to 570 nm. In yet another embodiment, the first light-emitting elements 202*a*, 202*b* and 202*c* all emit invisible light, such as Ultraviolet (UV) with wavelength ranging from 100 nm to 400 nm.

According to exemplary embodiments, all of red (R), green (G), and blue (B) light can be produced by using multiple mLEDs/μLEDs producing blue light. Red light is provided by disposing red phosphor on one of the multiple mLEDs/μLEDs and green light is provided by disposing green phosphor on another of the multiple mLEDs/μLEDs. With the mLEDs/μLEDs implemented based on blue light having a similar driving voltage, the driver circuit can be simplified.

Although the first light emitting device 202 as depicted in FIG. 2 has three first light-emitting elements 202*a*, 202*b* and 202*c*, the number of the light-emitting elements is not limited to this regard. For example, in some other embodiments, the first light emitting device 202 may include more or less (but greater than one) light-emitting elements.

From the circuit illustrated in FIG. 2, the power source ($V_{DD}$) on the subpixel unit 200 includes the power of the first light emitting device 202 and the power of the driving device 203.

$$\text{Power}=P_{LED}+P_{TFT}=(V_F+V_{DS})\times I$$

I is the current flowing through the first light emitting device 202 and the driving device 203, $V_F$ is the forward voltage of the first light emitting device 202, and $V_{DS}$ is the drain to source voltage of the driving device 203. In operation, the first light emitting device 202 is a constant current driving device, and the driving device 203 serves as a current source. The gate-to-source voltage ($V_{GS}$) of the driving device 203 controls the current I, and the current I determines the emittance of the first light emitting device 202. As the forward voltage of the light emitting device 202 is increased, less power is consumed on the driving device 203 and more power is consumed on the first light emitting device 202.

Figure 3A:
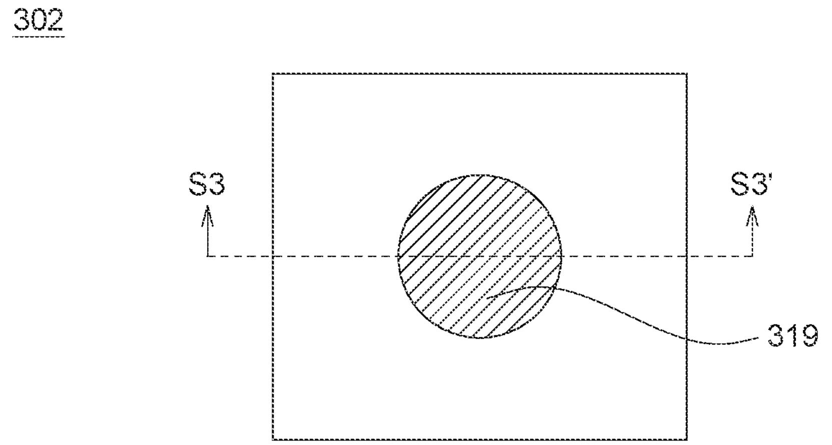
FIG. 3A is a top view illustrating the light emitting device according to an embodiment of the present application.
Figure 3B:
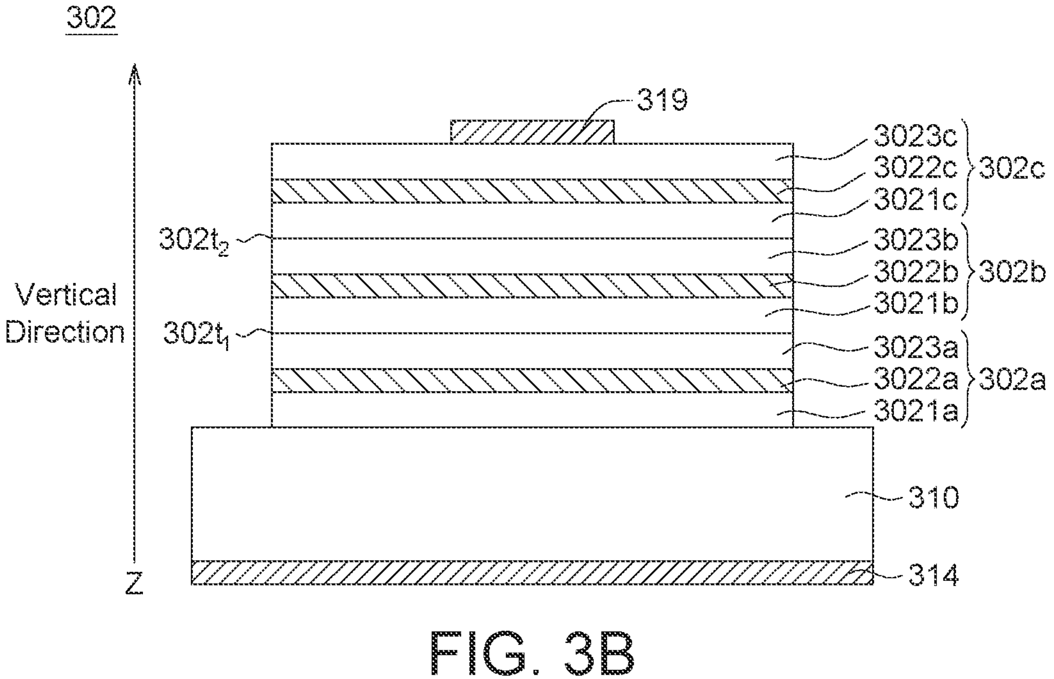
FIG. 3B is a cross-sectional view illustrating the light emitting device taking along the cut-line S3-S3' as depicted in FIG. 3A.

FIG. 3A is the top view illustrating the light emitting device 302 according to an embodiment of the present application. FIG. 3B is the cross-sectional view illustrating the light emitting device 302 taking along the cut-line S3-S3' as depicted in FIG. 3A. The light emitting device 302 is a μ-LED device or a mini-LED device having a stack structure composed of a plurality of light-emitting elements (such as a first light-emitting element 302*a*, a second light-emitting element 302*b*, and a third light-emitting element 302*c*) stacked on the substrate 310 and connected in series to form a multi-junction structure. Each of the light-emitting elements 302*a*, 302*b*, and 302*c* may include an n-type semiconductor layer, an active layer, and a p-type semiconductor layer. A tunnel junction may be formed between adjacent two of the light-emitting elements 302*a*, 302*b*, and 302*c* by means of a p-type semiconductor layer and an n-type semiconductor layer. The tunnel junction serves as an electrical connection between the adjacent two of the light-emitting elements 302*a*, 302*b*, and 302*c*.

In some embodiment, the light emitting device 302 can be applied to the first light emitting device 202 in the subpixel unit 200 as depicted in FIG. 2.

For example, the first light-emitting element 302*a* includes a first n-type semiconductor layer 3021*a*, a first active layer 3022*a*, and a first p-type semiconductor layer 3023*a* stacked in sequence along a vertical direction (Z direction) on the substrate 310.

The second light-emitting element 302*b* includes a second n-type semiconductor layer 3021*b*, a second active layer 3022*b*, and a second p-type semiconductor layer 3023*b* stacked in sequence along the vertical direction (Z direction) on the first light-emitting element 302*a*.

The third light-emitting element 302*c* includes a third n-type semiconductor layer 3021*c*, a third active layer 3022*c*, and a third p-type semiconductor layer 3023*c* stacked in sequence along the vertical direction (Z direction) on the second light-emitting element 302*b*.

A first tunnel junction 302$t_1$ may be formed between the first light-emitting element 302*a* and the second light-emitting element 302*b* by means of a p-type semiconductor layer and an n-type semiconductor layer. A second tunnel junction 302$t_2$ may be formed between the second light-emitting element 302*b* and the third light-emitting element 302*c* by means of a p-type semiconductor layer and an n-type semiconductor layer.

In the present embodiment, the contact layers 314 and 319 are formed at the opposite sides of the stack structure of the light emitting device 302. The contact layer 314 is electrically connected to the first n-type semiconductor layer 3021*a* of the first light-emitting element 302*a* through the substrate 310, and the contact layer 319 is electrically contact to the third p-type semiconductor layer 3023*c* of the third light-emitting element 302*c*.

The contact layers 314 and 319 may include Cu, W, Al, Ti, Ta, or the arbitrary combinations thereof. The tunnel junctions 302$t_1$, 302$t_2$ can be formed by stacking the p-type semiconductor layer and the n-type semiconductor layer through a metal-organic chemical vapor deposition (MOCVD) technology. Each of the tunnel junctions 302$t_1$, 302$t_2$ includes a heavily doped p-type semiconductor layer and a heavily doped n-type semiconductor layer. Alternatively, the tunnel junction 302$t_1$ or 302$t_2$ can be a layer constituted by transparent conductive material (such as ITO) formed by glue bonding or CVD technology.

The substrate 310 comprises a conductive substrate. The substrate 310 comprises a thickness within a range between 50 μm~250 μm, between 80 μm~200 μm in another embodiment, or between 100 μm~150 μm in a further embodiment.

In an embodiment of the present application, the metal organic chemical vapor deposition (MOCVD), molecular beam epitaxy (MBE), hydride vapor phase epitaxy (HYPE), physical vapor deposition (PVD), or ion plating method is performed to form the light-emitting elements 302*a*, 302*b*, and 302*c* with photoelectrical characteristics on the substrate 310, wherein the physical vapor deposition method comprises sputtering or evaporation. The light-emitting elements 302*a*, 302*b*, and 302*c* each includes a thickness larger than 3 μm and less than 6 μm, or larger than 4 μm and less than 5 μm.

The wavelength of the light emitted from the light-emitting elements 302*a*, 302*b*, or 302*c* is adjusted by changing the physical and chemical composition of the active layers 3022*a*, 3022*b*, or 3022*c*. The material of the active layers 3022*a*, 3022*b*, or 3022*c* comprises III-V group semiconductor materials, such as $Al_xIn_yGa_{(1-x-y)}N$, $Al_xGa_{(1-x)}As$, or $Al_xIn_yGa_{(1-x-y)}P$, wherein $0 \leq x, y \leq 1$; $(x+y) \leq 1$. When the material of the active layer 3022*a*, 3022*b*, or 3022*c* comprises AlGaAs or AlInGaP series material, the red light having a wavelength between 610 nm and 650 nm or the green light having a wavelength between 530 nm and 570 nm can be emitted. When the material of the active layer 3022*a*, 3022*b*, or 3022*c* comprises InGaN series material, the blue or the deep blue light having a wavelength between 400 nm and 490 nm or the green light having a wavelength between 490 nm and 550 nm can be emitted. When the material of the active layer 3022*a*, 3022*b*, or 3022*c* comprises AlGaN series or AlInGaN series material, the ultra-violet light having a wavelength between 250 nm and 400 nm can be emitted. The electrons and the holes combine in the active layers 3022*a*, 3022*b*, and 3022*c* under a current driving to convert the electrical energy into the light energy and then the light is emitted from the active layer 3022*a*, 3022*b*, or 3022*c*. The active layer 3022*a*, 3022*b*, and 3022*c* can be a single heterostructure (SH), a double heterostructure (DH), a double-side double heterostructure (DDH), or a multi-quantum well structure (MQW). The material of the active layers 3022*a*, 3022*b*, or 3022*c* can be i-type, p-type, or n-type semiconductor.

Each of the n-type semiconductor layers 3021*a*, 3021*b*, and 3021*c*, the p-type semiconductor layers 3023*a*, 3023*b*, and 3023*c*, or the active layers 3022*a*, 3022*b*, and 3022*c* can be a single layer or a structure comprising a plurality of layers. Although, the light emitting device 302 as depicted in FIG. 3B has three first light-emitting elements 302*a*, 302*b* and 302*c*, the number of the light-emitting elements is not limited to this regard. For example, in some other embodiments, the light emitting device 302 may include more or less (but greater than one) light-emitting elements.

Figure 4A:
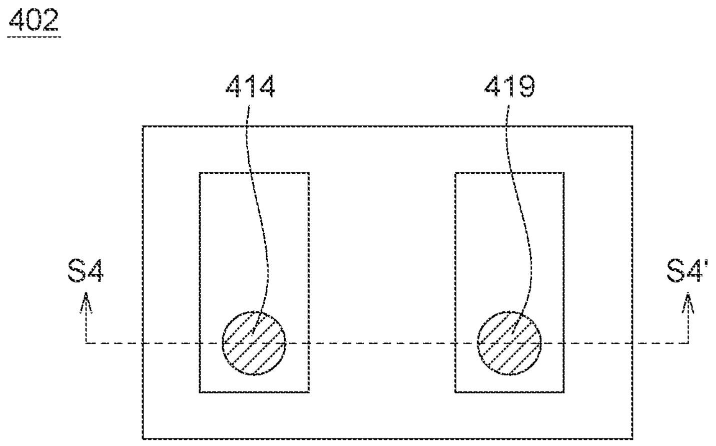
FIG. 4A is a top view illustrating the light emitting device according to an embodiment of the present application.
Figure 4B:
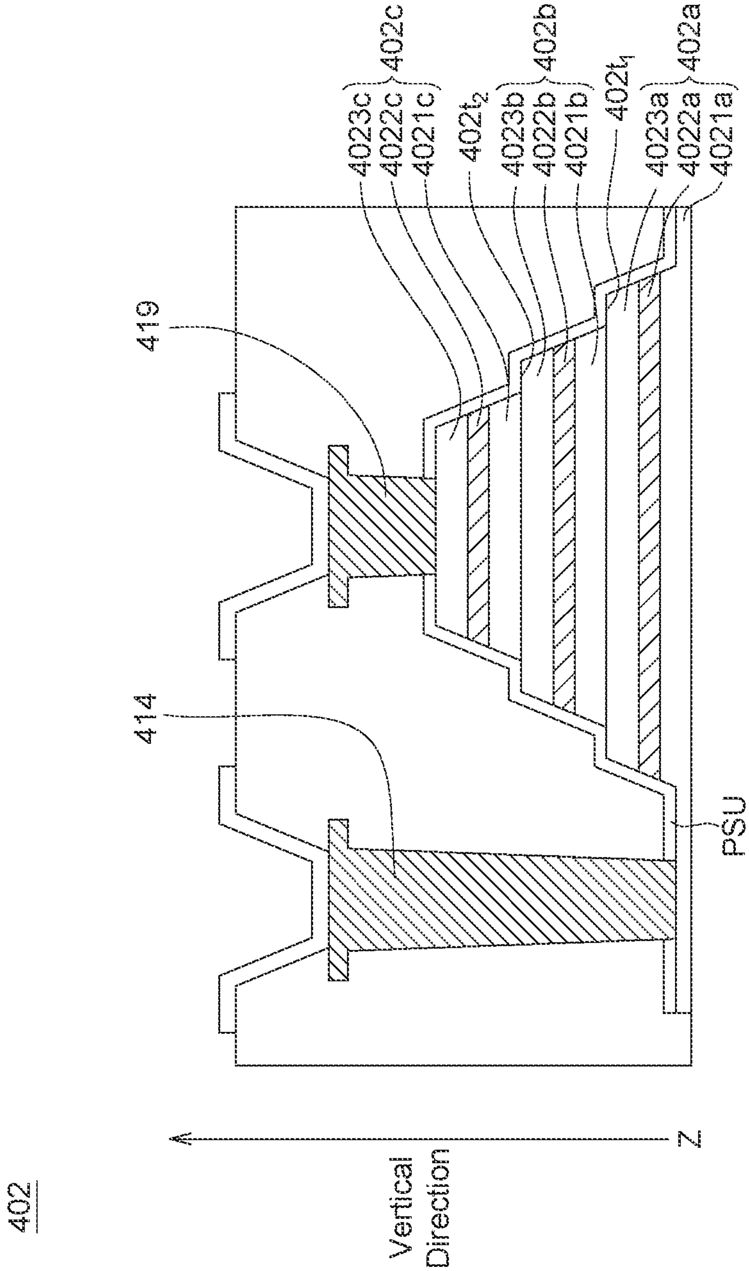
FIG. 4B is a cross-sectional view illustrating the light emitting device taking along the cut-line S4-S4' as depicted in FIG. 4A.

FIG. 4A is top view illustrating the light emitting device 402 according to another embodiment of the present application. FIG. 4B is a cross-sectional view illustrating the light emitting device 402 taking along the cut-line S4-S4' as depicted in FIG. 4A. The stack structure of the light emitting device 402 is similar to that of the light emitting device 302, except that the light emitting device 402 is a flip-chip form of p-LED/mini-LED device and the epitaxial growth substrate can be retained or removed after forming the stack structure. Specifically, after the first light-emitting element 402*a*, the second light-emitting element 402*b* and the third light-emitting element 402*c* are formed.

The light emitting device 402 is a p-LED device or a mini-LED device having a stack structure composed of a plurality of light-emitting elements (such as a first light-emitting element 402*a*, a second light-emitting element 402*b*, and a third light-emitting element 402*c*) stacked along a vertical direction (Z direction) and connected in series to form a multi-junction structure. Each of the light-emitting elements 402*a*, 402*b*, and 402*c* may include an n-type semiconductor layer, an active layer, and a p-type semiconductor layer. A tunnel junction 402*t*$_1$ or 402*t*$_2$ may be formed between adjacent two of the light-emitting elements 402*a*, 402*b*, and 402*c* by means of a p-type semiconductor layer and an n-type semiconductor layer. The tunnel junction serves as an electrical connection between the adjacent two of the light-emitting elements 402*a*, 402*b*, and 402*c*. In some embodiments, the light emitting device 402 can be applied to the light emitting device 202 in the subpixel unit 200 as depicted in FIG. 2.

For example, the first light-emitting element 402*a* includes a first n-type semiconductor layer 4021*a*, a first active layer 4022*a*, and a first p-type semiconductor layer 4023*a* stacked in sequence along a vertical direction (Z direction).

The second light-emitting element 402*b* includes a second n-type semiconductor layer 4021*b*, a second active layer 4022*b*, and a second p-type semiconductor layer 4023*b* stacked in sequence along a vertical direction (Z direction) on the first light-emitting element 402*a*.

The third light-emitting element 402*c* includes a third n-type semiconductor layer 4021*c*, a third active layer 4022*c*, and a third p-type semiconductor layer 4023*c* stacked in sequence along a vertical direction (Z direction) on the second light-emitting element 402*b*.

A first tunnel junction 402*t*$_1$ may be formed between the first light-emitting element 402*a* and the second light-emitting element 402*b* by means of a p-type semiconductor layer and an n-type semiconductor layer. A second tunnel junction 402*t*$_2$ may be formed between the second light-emitting element 402*b* and the third light-emitting element 402*c* by means of a p-type semiconductor layer and an n-type semiconductor layer.

In the present embodiment, the contact layers 414 and 419 are formed at the same side of the stack structure of the light emitting device 402. The contact layer 414 is electrically connected to the first n-type semiconductor layer 4021*a* of the first light-emitting element 402*a* and the contact layer 419 is electrically contact to the third p-type semiconductor layer 4023*c* of the third light-emitting element 402*c*.

The contact layers 414 and 419 may include Cu, W, Al, Ti, Ta, or the arbitrary combinations thereof. The tunnel junction 402*t*$_1$ or 402*t*$_2$ can be formed by stacking the p-type semiconductor layer and the n-type semiconductor layer through a metal-organic chemical vapor deposition (MOCVD) technology. The tunnel junctions 402*t*$_1$, 402*t*$_2$ include heavily doped p-type semiconductor layer and a heavily doped n-type semiconductor layer Alternatively, the tunnel junction 402*t*$_1$ or 402*t*$_2$ can be a layer constituted by transparent conductive material (such as ITO) formed by glue bonding or CVD technology.

In an embodiment, the light emitting device 402 comprises a substrate (not shown) comprising an insulating substrate. The substrate (not shown) can be a growth substrate for the epitaxial growth of the light-emitting elements 402*a*, 402*b*, and 402*c*. The substrate (not shown) comprises gallium arsenide (GaAs) wafer for epitaxially growing aluminum gallium indium phosphide (AlGaInP), or silicon (Si) wafer, sapphire ($Al_2O_3$) wafer, gallium nitride (GaN) wafer, silicon carbide (SiC) wafer, or aluminum nitride (AlN) wafer for epitaxially growing gallium nitride series materials, such as gallium nitride (GaN), indium gallium nitride (InGaN), aluminum indium gallium nitride (AlInGaN), or aluminum gallium nitride (AlGaN). The substrate (not shown) comprises a thickness within a range between 50 μm~250 μm, between 80 μm~200 μm in another embodiment, or between 100 μm~150 μm in a further embodiment. In another embodiment, the light emitting device 402 does not comprises the growth substrate because the growth substrate for the epitaxial growth of the light-emitting elements 402*a*, 402*b*, and 402*c* is removed.

In an embodiment of the present application, the metal organic chemical vapor deposition (MOCVD), molecular beam epitaxy (MBE), hydride vapor phase epitaxy (HYPE), physical vapor deposition (PVD), or ion plating method is performed to form the light-emitting elements 402a, 402b, and 402c with photoelectrical characteristics on the substrate (not shown), wherein the physical vapor deposition method comprises sputtering or evaporation.

The wavelength of the light emitted from the light-emitting elements 402a, 402b, and 402c is adjusted by changing the physical and chemical composition of the active layer 4022a, 4022b, or 4022c. The material of the active layer 4022a, 4022b, or 4022c comprises III-V group semiconductor materials, such as AlGaAs or AlInGaP series material. The AlGaAs or AlInGaP series material includes $Al_xIn_yGa_{(1-x-y)}N$, $Al_xGa_{(1-x)}As$ or $Al_xIn_yGa_{(1-x-y)}P$, wherein 0≤x, y≤1; (x+y)≤1. When the material of the active layer 4022a, 4022b, or 4022c comprises AlGaAs or AlInGaP series material, the red light having a wavelength between 610 nm and 650 nm or the green light having a wavelength between 530 nm and 570 nm can be emitted. When the material of the active layer 4022a, 4022b, or 4022c comprises InGaN series material, the blue or the deep blue light having a wavelength between 400 nm and 490 nm or the green light having a wavelength between 490 nm and 550 nm can be emitted. When the material of the active layer 4022a, 4022b, or 4022c comprises AlGaN series or AlInGaN series material, the ultraviolet light having a wavelength between 250 nm and 400 nm can be emitted. The electrons and the holes combine in the active layers 4022a, 4022b, and 4022c under a current driving to convert the electrical energy into the light energy and then the light is emitted from the active layer 4022a, 4022b, or 4022c. The active layers 4022a, 4022b, and 4022c can be a single heterostructure (SH), a double heterostructure (DH), a double-side double heterostructure (DDH), or a multi-quantum well structure (MQW). The material of the active layer 4022a, 4022b, or 4022c can be i-type, p-type, or n-type semiconductor.

Each of the n-type semiconductor layer 4021a, 4021b, and 4021c, the p-type semiconductor layer 4023a, 4023b, and 4023c, or the active layer 4022a, 4022b, and 4022c can be a single layer or a structure comprising a plurality of layers. Although the light emitting device 402 as depicted in FIG. 4B has three first light-emitting elements 402a, 402b and 402c, the number of the light-emitting elements is not limited to this regard. For example, in some other embodiments, the light emitting device 402 may include more or less (but greater than one) light-emitting elements.

In addition, the first light-emitting element 402a, the second light-emitting element 402b and the third light-emitting element 402c may be subjected to a passivation treatment to form an insulating layer PSU covering there on. In an embodiment of the present application, the sidewalls of the light-emitting elements 402a, 402b, and 402c can be covered by the insulating layer PSU including $SiO_x$ or $SiN_x$. In another embodiment of the present application, the insulating layer PSU can be a Distributed Bragg Reflector (DBR) structure that can selectively reflect light of a specific wavelength. The Distributed Bragg Reflector (DBR) can be formed by stacking layers such as $SiO_2/TiO_2$ or $SiO_2/Nb_2O_5$.

Figure 5:
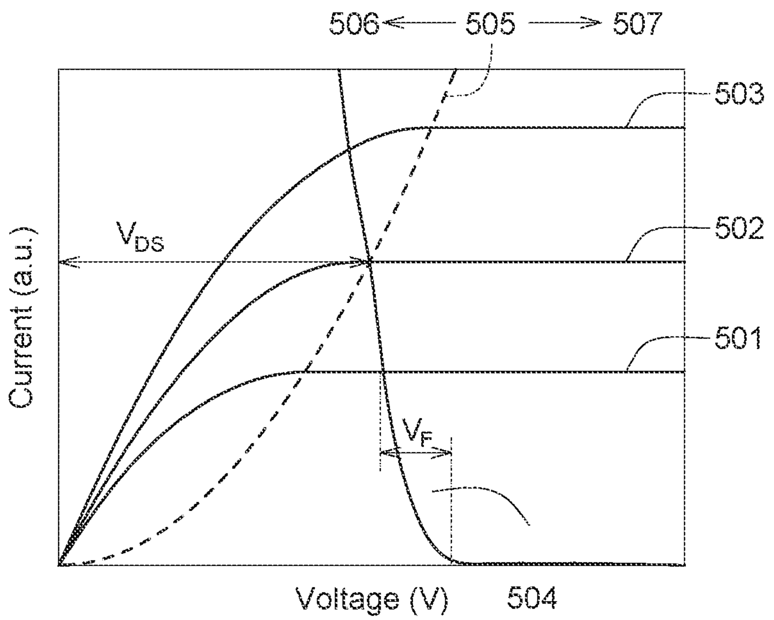
FIG. 5 is a diagram illustrating the current-voltage characteristic curves (I-V curves) of the driving device and the I-V curve of the light emitting device as depicted in FIG. 2.

FIG. 5 is a diagram illustrating the current-voltage characteristic curves (I-$V_{DS}$ curves) 501-503 of the driving device 203 illustrated in FIG. 2 under different voltage ($V_{GS}$) and the I-$V_F$ curve 504 of the light emitting device 202 (the light-emitting elements 202a, 202b, and 202c connected in series as depicted in FIG. 2). I-$V_{DS}$ curves 501-503 respectively represent the relationship between the current (I) flowing through the terminal 203a and the terminal 203b, and the drain-to-source voltages ($V_{DS}$) there between under different voltages ($V_{GS}$) applied on the control terminal 203c of the driving device 203. $V_{GS}$ of I-$V_{DS}$ curve 503 is larger than $V_{GS}$ of I-$V_{DS}$ curve 502 and $V_{GS}$ of I-$V_{DS}$ curve 502 is larger than $V_{GS}$ of I-$V_{DS}$ curve 501. I-$V_F$ curve 504 represents the relationship between the current (I) passing though the light-emitting elements 202a, 202b, and 202c and the forward voltages ($V_F$) of the light emitting device 202.

The dashed black line 505 delineate the border between the linear region 506 (the left) and the saturation region 507 (the right) of the driving device 203 under different $V_{GS}$. In the saturation region, the current (I) hardly changes with the drain-to-source voltages ($V_{DS}$). $V_{DD}$ depicted in FIG. 2 is approximately equal to the sum of $V_{DS}$ and $V_F$. The power consumption ratio between the TFT and the LED is approximately equal to $V_{DS}/V_F$. The higher forward voltages ($V_F$) the light emitting device 202 has, the lower drain-to-source voltages ($V_{DS}$) the driving device 203 has. In an embodiment, the sum of the forward voltages ($V_F$) of the light-emitting elements 202a, 202b and 202c can be measured at 20 mA. For example, in a case where $V_{DD}$ has a value between 11V and 17V, the forward voltage ($V_F$) of each of the light-emitting elements 202a, 202b, and 202c is between 2 V and 4 V, and then the light emitting device 202 has $V_F$ between 6 V and 12 V in a case where it includes two or more light-emitting elements connected in series. With the further reduction of pixel dimensions for μLED display and the shrinkage of the LED size (such as the size of the light-emitting elements 202a, 202b, and 202c), the heat from the non-radiative energy accumulated inside the device is more serious. By this approach, the non-radiative energy consumption is reduced and that is important for μLED display.

Figure 6:
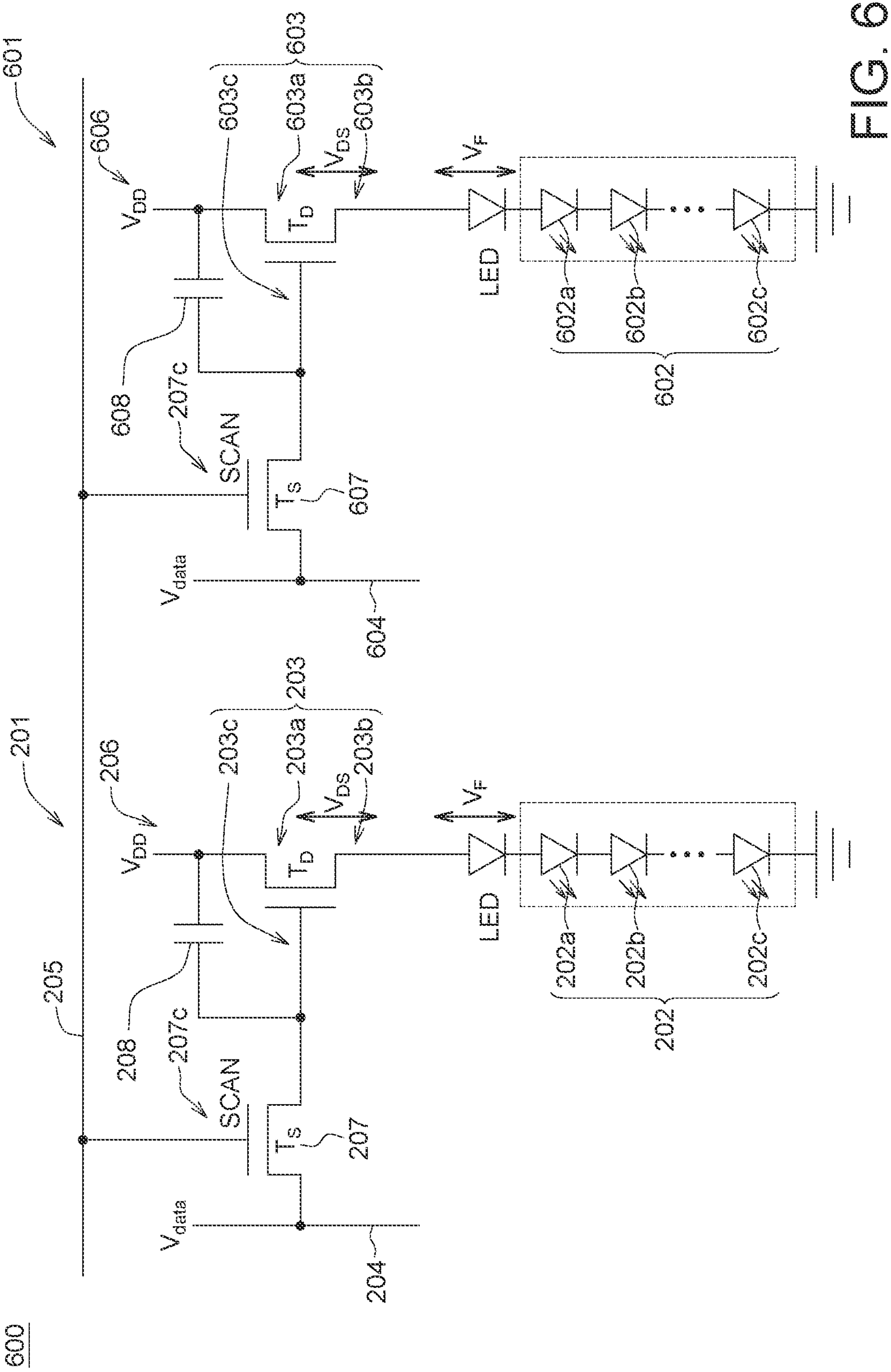
FIG. 6 is a diagram illustrating an equivalent circuit of a pixel unit according to another embodiment of the present application.

FIG. 6 is a diagram illustrating an equivalent circuit of a pixel unit 600 according to another embodiment of the present application. The arrangement of the pixel unit 600 is similar to that of the subpixel unit 200, except that the pixel unit 600 further includes a second thin film circuit unit 601 and a second light emitting device 602 both connected to the first thin film circuit unit 201 and the first light emitting device 202 in parallel. In the present embodiment, the second thin film circuit unit 601 may be identical to the first thin film circuit 201 and connected to the first thin film circuit unit 201 in parallel by the scan line 205.

The second thin film circuit unit 601 further includes a data line 604, a driving device 603, a switching device 607, and a capacitor 608. The driving device 603 has a terminal 603a (such as a source terminal), a terminal 603b (such as a drain terminal) and a control terminal 603c. The control terminal 603c of the driving device 603 is connected to the data line 604 through the switching device 607. The terminal 603a is connected to the power source ($V_{DD}$) 606. The terminal 603b is connected to the second light emitting device 602.

The second light emitting device 602 includes a plurality of second light-emitting elements 602a, 602b, and 602c connected in series and connected to the terminal 603b of the driving device 603. One end of the capacitor 608 is connected to the power source 606 ($V_{DD}$), and the other end of the capacitor 608 is connected to the control terminal 603c of the driving device 603 and the switching device 607 through a node therebetween.

In some embodiments of the present application, the first light emitting device 202 connected to the first thin film circuit unit 201 and the second light emitting device 602 connected to the second thin film circuit unit 601 emits lights with two different wavelengths. For example, in one embodiment, the first light emitting device 202 emits a blue light and the second light emitting device 602 emits a red light or a green light. In some other embodiments of the present application, the first light emitting device 202 is identical to the second light emitting device 602 such that the first light emitting device 202 and the second light emitting device 602 emit lights with substantially the same wavelength.

It should be appreciated that, although merely two thin film circuit units (the first thin film circuit unit 201 and the second thin film circuit unit 601) are depicted in FIG. 6, the pixel unit 600 may include more thin film circuit units, and each respectively connects to one light emitting device as disclosed above. For example, in some embodiments, the pixel unit 600 can be expanded and arranged to form an active pixel array used for a mLED/μLED display (not shown).

Figure 7:
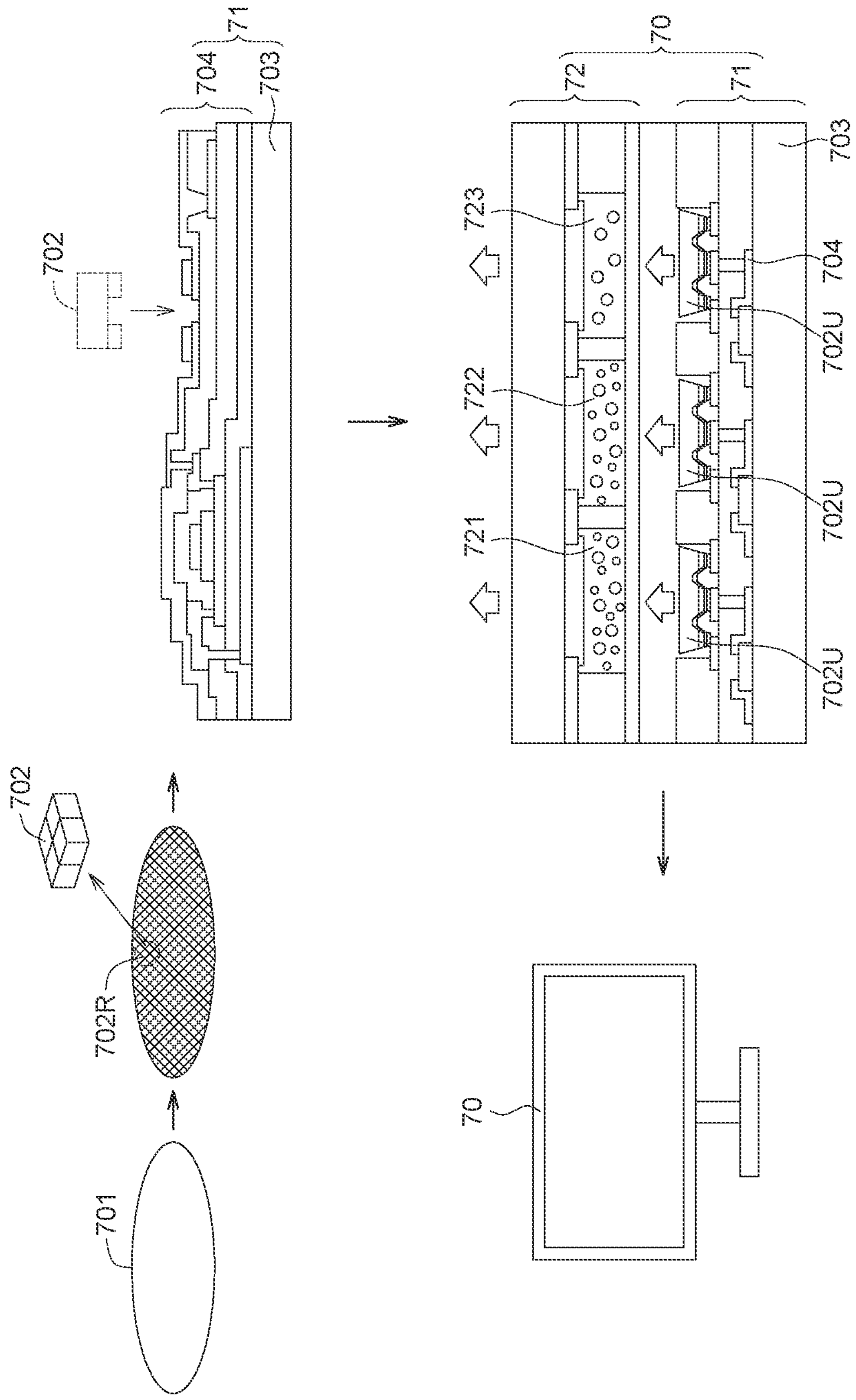
FIG. 7 is a diagram illustrating the process for forming a pixel unit in a display apparatus according to an embodiment of the present application.

FIG. 7 is a diagram illustrating the process for forming the pixel unit 600 as mentioned above in a display apparatus 70 according to an embodiment of the present application. The display apparatus 70 applying the pixel unit 600 can be a μ-LED TV or a mini-LED TV. The display apparatus 70 includes a plurality of pixel units 600 for displaying an image. The pixel unit 600 is a minimum unit for displaying the image. Each pixel unit 600 may emit white light and/or color light, and include subpixel unit 201, 601 for emitting one color or a plurality of subpixel units 201, 601 for emitting different colors.

The process for forming the pixel unit 600 includes the following steps. Firstly, a plurality of mLED/μLED chips 702 is provided from a semiconductor wafer 701 to form a mLED/μLED chip array 702R. Each of the mLED/μLED chips 702 includes one of the light emitting device 302 and 402 as mentioned above. After a wafer dicing process (not shown), the separated mLED/μLED chips 702 are then transferred on and electrically connected to a TFT circuit 704 to form the pixel unit 600 as mentioned above. A device substrate 703 including integrated circuit or micro electromechanical system can be provided on the TFT circuit 704 to form a backplane 71 built in a display apparatus 70.

In an embodiment of the present application, the mLED/μLED chips 702 includes a first chip for emitting red light, a second chip for emitting green light, and a third chip for emitting blue light.

In some embodiments of the present application, each of the mLED/μLED chips 702 may emit blue light (referred to as a blue chip) or UV (referred to as a UV chip 702U). A color filter 72 is required to assemble with the backplane 71 to form the display apparatus 70 with a plurality of color pixels. In an embodiment, each pixel of the display apparatus 70 includes a UV chip 702U assembled with a blue quantum dot (QD) filter element 723, a UV chip 702U assembled with a red quantum dot (QD) filter element 721, and a UV chip 702U assembled with a green quantum dot (QD) filter element 722.

In another embodiment, each pixel of the display apparatus 70 include a blue chip assembled with a red quantum dot (QD) filter element 721, a blue chip assembled with a green quantum dot (QD) filter element 722, and a blue chip.

According to the above embodiments, the pixel unit 600 and the display apparatus 70 applying the same are provided, wherein the pixel unit 600 includes the subpixel unit including the first thin film circuit unit 201 and the first light emitting device 202 connected to the driving device 203. The plurality of light-emitting elements 202*a*, 202*b*, and 202*c* is connected in series to serve the first light emitting device 202, and a total voltage of the plurality of light-emitting elements 202*a*, 202*b*, and 202*c* is limited not less than ⅓ of a saturation voltage of the driving device 203 for turn on the first light emitting device 202. By these approach, additional device for balancing the power consumption ratio between the driving device 203 and LED ($V_{DS}/V_F$) may be no longer required as the amount of the light-emitting elements is increased, meanwhile the luminance of the first light emitting device 202 in the subpixel unit can also be increased when the light emitting device 202 size shrinks.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pixel unit, comprising:

a first thin film circuit unit, comprising a first driving device comprising:

a first terminal, configured to receive a first signal;

a second terminal; and a control terminal, configured to receive a second signal to control on/off of the first driving device for allowing the first signal transmitted to the second terminal; and a first light emitting device, comprising a plurality of first light-emitting elements connected in series and connected to the second terminal;

wherein the plurality of first light-emitting elements has a total forward voltage which is not less than ⅓ of a saturation voltage of the first driving device.

2. The pixel unit according to claim 1, wherein the first driving device includes a thin film transistor (TFT), and the first light emitting device includes a micro-light emitting diode (μLED) device or a mini-LED device (mLED).

3. The pixel unit according to claim 1, wherein the first light emitting device includes a forward voltage between 6 V and 12 V.

4. The pixel unit according to claim 3, wherein the plurality of first light-emitting elements each includes a forward voltage between 2 V and 4 V.

5. The pixel unit according to claim 1, wherein the plurality of first light-emitting elements is connected in series to form a multi-junction structure.

6. The pixel unit according to claim 5, wherein the plurality of first light-emitting elements is stacked to form a stack structure.

7. The pixel unit according to claim 6, wherein each of the plurality of first light-emitting elements comprises an n-type semiconductor layer, an active layer, and a p-type semiconductor layer.

8. The pixel unit according to claim 7, further comprising a substrate formed under the stack structure, wherein the substrate includes a conductive substrate.

9. The pixel unit according to claim 1, wherein the plurality of first light-emitting elements is configured to emit lights substantially having a same wavelength.

10. The pixel unit according to claim 1, wherein each of the plurality of first light-emitting elements comprises a thickness larger than 4 μm and less than 5 μm.

11. The pixel unit according to claim 1, further comprising a second thin film circuit unit comprising a second driving device, and a second light emitting device comprising a plurality of second light-emitting elements connected in series and connected to the second driving device.

12. The pixel unit according to claim 11, wherein the first light emitting device and the second light emitting device are configured to emit lights with a same wavelength.

13. The pixel unit according to claim 11, wherein the first light emitting device and the second light emitting device are configured to emit lights with different wavelengths.

14. The pixel unit according to claim 13, wherein the first light emitting device is configured to emit a blue light, and the second light emitting device is configured to emit a red light or a green light.

15. The pixel unit according to claim 11, wherein the first light emitting device and the second light emitting device are configured to emit invisible light.

16. The pixel unit according to claim 2, wherein the μ-LED device has a length or width ranging from 100 μm to 10 μm, or the mini-LED device has a length or width ranging from 200 μm to 100 μm.

17. A display apparatus comprising:

a pixel unit, comprising:

a thin film circuit unit, comprising a driving device comprising:

a first terminal, configured to receive a first signal;

a second terminal; and a control terminal, configured to receive a second signal to control on/off of the driving device for allowing the first signal transmitted to the second terminal; and a light emitting device, comprising a plurality of light-emitting elements connected in series and connected to the second terminal;

wherein the plurality of light-emitting elements has a total forward voltage which is not less than ⅓ of a saturation voltage of the first driving device.

18. The display apparatus according to claim 17, wherein the light emitting device includes a forward voltage between 6 V and 12V.

19. The pixel unit according to claim 17, wherein the plurality of first light-emitting elements each includes a forward voltage between 2 V and 4 V.

20. The display apparatus according to claim 17, wherein the light emitting device includes a micro-light emitting diode (u-LED) device having a length or width ranging from 100 μm to 10 μm or a mini-LED device having a length or width ranging from 200 μm to 100 μm.

* * * * *